(12) United States Patent
Van Camp et al.

(10) Patent No.: US 7,511,345 B2
(45) Date of Patent: Mar. 31, 2009

(54) BULK RESISTANCE CONTROL TECHNIQUE (75) Inventors: Benjamin Van Camp, Antwerpen (BE); Gerd Vermont, Ruiselede (BE)

(73) Assignees: Sarnoff Corporation, Princeton, NJ (US); Sarnoff Europe, Gistel (BE)

( * ) Notice: Subject to any disclaimer, the term of this patent is extended or adjusted under 35 U.S.C. 154(b) by 43 days.

(21) Appl. No.: 11/451,187

(22) Filed: Jun. 12, 2006

(65) Prior Publication Data
US 2007/0045751 A1 Mar. 1, 2007

Related U.S. Application Data (60) Provisional application No. 60/692,675, filed on Jun. 21, 2005.

(51) Int. Cl.
H01L 23/62 (2006.01)
H01L 29/72 (2006.01)
H01L 29/74 (2006.01)
H01L 31/111 (2006.01)
H01L 29/73 (2006.01)
H01L 27/10 (2006.01)
H01L 29/76 (2006.01)
H01L 29/94 (2006.01)
H01L 31/062 (2006.01)
H01L 31/113 (2006.01)
H01L 31/119 (2006.01)

(52) U.S. Cl. ........................ 257/355; 257/173; 257/174; 257/202; 257/356; 257/357; 257/358; 257/359; 257/360; 257/361; 257/362; 257/363; 257/374; 257/401; 257/E21.421; 257/E21.455; 257/E21.623; 257/E21.637; 257/E29.019

(58) Field of Classification Search ................. 257/202, 257/355–363, 374, 401, 173–174, E21.421, 257/E21.455, E21.623, E21.637, E29.019
See application file for complete search history.

(56) References Cited

U.S. PATENT DOCUMENTS

| 3,868,721 | A  | * | 2/1975  | Davidsohn ................... 257/395 |
| 5,994,738 | A  | * | 11/1999 | Wollesen ..................... 257/347 |
| 6,072,214 | A  | * | 6/2000  | Herzer et al. ................ 257/331 |
| 6,767,779 | B2 | * | 7/2004  | Parker et al. ................. 438/204 |
| 6,909,149 | B2 | * | 6/2005  | Russ et al. ................... 257/355 |
| 7,005,708 | B2 | * | 2/2006  | Mergens et al. ............. 257/360 |
| 2002/0033507 | A1 | * | 3/2002 | Verhaege et al. ............ 257/360 |
| 2004/0018698 | A1 | * | 1/2004 | Schmidt ...................... 438/444 |
| 2004/0189407 | A1 | * | 9/2004 | Manna et al. ................. 331/57 |
| 2005/0029597 | A1 | * | 2/2005 | Worley ....................... 257/355 |
| 2005/0040437 | A1 | * | 2/2005 | Knoedgen ................... 257/213 |

OTHER PUBLICATIONS

International Search Report dated Jun. 17, 2008.

* cited by examiner

*Primary Examiner*—Ida M Soward
(74) *Attorney, Agent, or Firm*—Lowenstein Sandler PC (57) ABSTRACT

The present invention provides a MOS transistor device for providing ESD protection including at least one interleaved finger having a source, drain and gate region formed over a channel region disposed between the source and the drain regions. The transistor device further includes at least one isolation gate formed in at least one of the interleaved fingers. The device can further include a bulk connection coupled to at least one of the source, drain and gate regions via through at least one of diode, MOS, resistor, capacitor inductor, short, etc. The bulk connection is preferably isolated through the isolation gate.

17 Claims, 6 Drawing Sheets

FIG. 1

Prior Art

FIG. 2

Prior Art

FIG. 3

Prior Art

FIG. 4A

FIG. 4B
CROSSECTION A

FIG. 4C
CROSSECTION B

FIG. 4D
CROSSECTION C

BULK RESISTANCE CONTROL TECHNIQUE

CROSS REFERENCES

This patent application claims the benefit of U.S. Provisional Application Ser. No. 60/692,675 filed Jun. 21, 2005, the contents of which are incorporated by reference herein.

FIELD OF THE INVENTION

This invention generally relates to the field of electrostatic discharge (ESD) protection circuitry, and more specifically, for providing a technique for implementing bulk connection to improve the performance of metal oxide semiconductor (MOS) devices in the silicon over insulator (SOI) protection circuitry of an integrated circuit (IC).

BACKGROUND OF THE INVENTION

Recently, advanced SOI technology nodes are being used more extensively due to a number of advantages mainly related to the reduction of the power consumption, smaller silicon area, lower gate delay and reduced parasitic junction capacitance. Moreover, due to the completely isolated transistors, latch-up is no longer an issue.

However, SOI technology comes also with a few disadvantages such as the higher cost for starting material, floating body and history effects, increased self-heating issues and higher design complexity. Another main disadvantage is the fact that traditional snap-based ESD solutions have a much reduced (It2) failure current. This It2 reduction compared to bulk is related to the thin silicon film and the complete isolation of the transistors which limits the dissipation and transfer of the generated heat.

For ESD protection, the MOS device is often used in bipolar mode. Avalanche multiplication on the drain side of the MOS triggers the intrinsic parasitic bipolar device. The amount of current needed, and thus the amount of avalanche multiplication needed, scales inversely proportional with the resistance of the Pwell of NMOS (Nwell in case of PMOS) between pwell (Nwell) connection and the gate region. Since the avalanche multiplication causes heat, reducing the avalanche multiplication can increase the failure current It2 of the MOS device. Therefore, it is important to control the bulk resistance to adjust the ESD properties of the MOS device.

Figure 1:
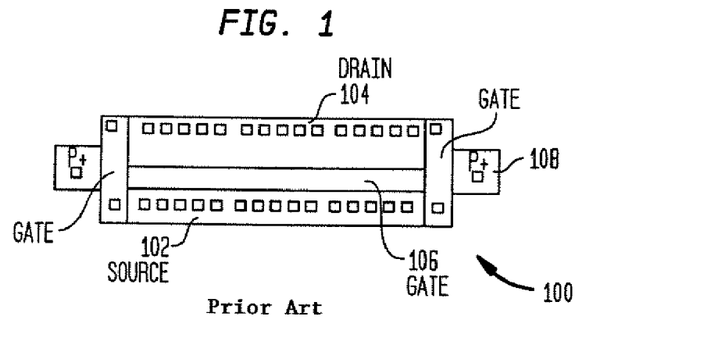
FIG. 1 depicts a top view of a prior art MOS illustrating a one finger device having bulk connection SOI by extending the gate to the bulk connection.

In most CMOS processes the bulk connection is created by adding guard rings around the MOS device. For example, a guard ring is a heavily p-doped region surrounding the MOS. This p-doped region, the same doping as the Pwell, connects the pwell with an external node. With this node the Pwell of the NMOS is controlled. In SOI technologies three methods exist. One such method includes a schematic to view layout of a single finger MOS device 100 having source region 102, drain region 104, and a gate region 106 disposed between the source 102 and the drain regions 104 as shown in FIG. 1. In this process, a bulk connection 108 is placed at the end of the gate 106. The gate 106 extension to the bulk connection 108 area is necessary to avoid isolating the bulk connection form the gate area with isolation such as a shallow trench isolation (STI) or deep trench isolation (DTI) or other isolations known to one skilled in the art. The disadvantage with this technique is that the bulk connection is only at the both sides of the gate. With large gate width only the side parts of the MOS has a good connection with the bulk connection. The middle part is connected through a large (well) resistance with the bulk connection.

Figure 2:
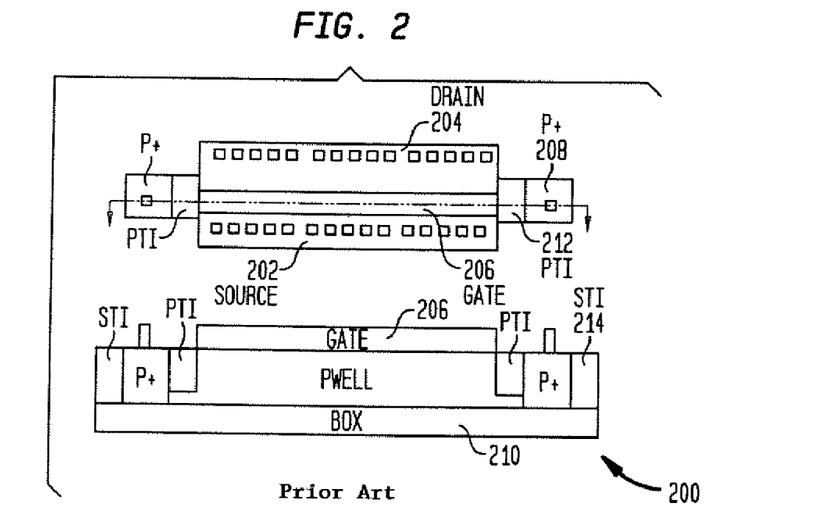
FIG. 2 depicts a top view of a prior art MOS illustrating a one finger device having bulk connection SOI by using PTI.

A second technique is displayed in FIG. 2 which includes a schematic layout view and cross section view of a single finger MOS device 200 having source region 202, drain region 204, and a gate region 206 disposed between the source 202 and the drain regions 204. A bulk connection 208 is placed at the end of the gate 206. This technique includes an isolation between the gate area 206 and bulk connection 208 is used which does not reach to a buried oxide (BOX) 210. This isolation is commonly referred to as PTI (partial trench isolation) 212 as shown in FIG. 1. In some SOI technologies, an STI (Shallow trench isolation) 214 or another isolation can be used with the same effect as illustrated in FIG. 2. A very basic layout view and cross section are shown in FIG. 2. Note the difference between the PTI 212, which does not reach to the BOX 210, however, and STI 214 which does reach down to the BOX 210. However, in some technologies the STI does not reach to the box either. In this case there is no need for a separate PTI layer and STI can be used instead. The disadvantage of this technique is similar to the technique discussed in FIG. 1 that the bulk connection is only at the both sides of the gate. Another disadvantage is that an extra process option, for example PTI is needed. Since extra process steps are very costly, this technique is undesirable.

Figure 3:
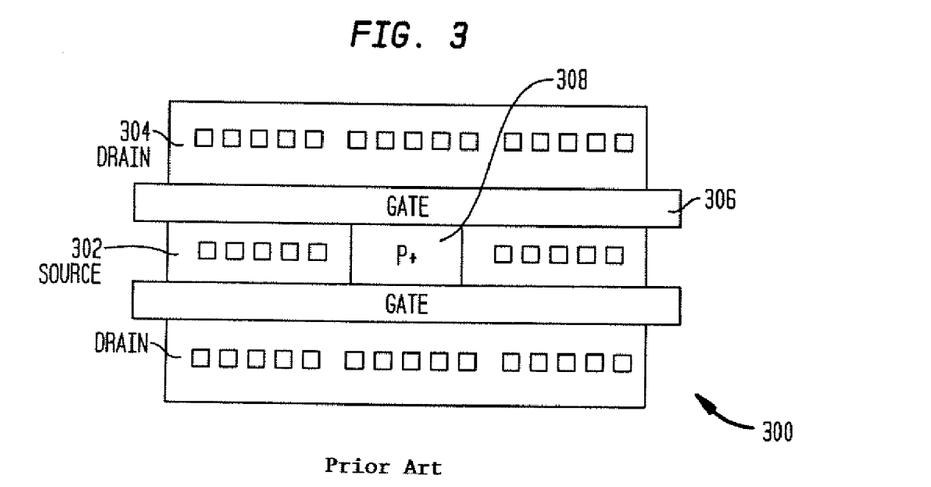
FIG. 3 depicts a top view of a prior art MOS illustrating a multiple finger device having bulk connection SOI by interrupting the source of the MOS device.

A third technique includes a schematic layout of a top view of a two finger MOS device 300 having a source regions 302, drain regions 304 and gate regions 306 disposed between the source 302 and the drain regions 304. This process includes interrupting the source 302 with a bulk connection area 308. Silicide shorts this region with the source 302. This is shown in FIG. 3, where there is bulk connection 308 through P+ area, interrupting the source 302 of the MOS device 300. The silicide layer connects the bulk P+ area with the source. The disadvantage if this technique is that the bulk connection is always shorten to the source. In some cases this is acceptable, but normally it is advantageous (improved triggering) if the bulk connection can be controlled in a different way then the shortening to source.

Therefore, a need exists to provide an improved technique enabling a better control of the bulk resistance to adjust the ESD properties for an improved performance of the MOS devices. Furthermore, it is advantageous to have a good bulk connection not only to control the bulk of one finger, but also to couple the different fingers (channel regions) together to improve multifinger triggering.

SUMMARY OF THE INVENTION

In one embodiment of the present invention, there is disclosed an electrostatic discharge (ESD) MOS transistor for providing ESD protection. The MOS transistor includes at least one interleaved finger having at least one source region of a first conductivity type, at least one drain region of the first conductivity type and at least one gate region formed over a channel region disposed between the source and drain regions. The MOS transistor further includes at least one isolation gate formed in at least one of the source, the drain and the gate regions of the at least one interleaved finger.

In another embodiment of the present invention, there is disclosed a MOS transistor for providing ESD protection. The MOS transistor includes at least one interleaved finger having at least one source region of first conductivity type, at least one drain region of the first conductivity type and at least one gate region formed over a channel region disposed between the source and drain regions. The MOS transistor also includes at least one isolation gate formed in at least one of the source, the drain and the gate regions of the at least one interleaved finger. The MOS transistor further includes a bulk connection of a second conductivity type placed in one of the source, gate and drain regions of the at least one interleaved finger.

In further embodiment of the present invention, there is disclosed a MOS transistor for providing ESD protection. The MOS transistor includes a plurality of interleaved fingers. Each of the fingers include at least one source region, at least one drain region and at least one gate region formed over a channel region disposed between the source and the drain regions, such that the channel regions of the two fingers are connected together by at least one isolation gate.

DETAILED DESCRIPTION OF THE INVENTION

The process steps and structures described below do not form a complete process flow for manufacturing integrated circuits (ICs). The present invention can be practiced in conjunction with silicon-on-insulator (SOI) integrated circuit fabrication techniques currently used in the art, and only so much of the commonly practiced process steps are included as are necessary for an understanding of the present invention. The figures representing cross-sections and layouts of portions of an IC during fabrication are not drawn to scale and form, but instead are drawn so as to illustrate the important features of the invention.

The present invention is described with reference to SOI CMOS devices. However, those of ordinary skill in the art will appreciate that selecting different dopant types and adjusting concentrations or changing the isolation types allows the invention to be applied to other processes that are susceptible to damage caused by ESD. Furthermore, it is noted that the present invention is discussed in terms of NMOS ESD devices, however, those skilled in the art recognize that the present invention is also applicable to PMOS ESD devices in a similar manner.

The invention proposes a new layout technique enabling a better control of the bulk resistance by using external impedance elements such as resistors. Key to the invention is the isolation of the bulk connection from drain and source by either adding silicide block (SB) or introducing a poly gate between drain/source and bulk connection. In previous art this isolation was created by using trench isolations such as STI, PTI or DTI. In this invention, another approach is introduced, using either a poly gate or a silicide block layer. For SOI technologies, or other technologies where an isolated Pwell is possible, this external impedance provides an excellent way of controlling the bulk resistance. The advantage of controlling the bulk in this manner is that during ESD, the NMOS is turned much faster in snapback than when the bulk is connected to ground. During normal operation the bulk can be connected to ground to limit leakage. Especially for SOI technologies, this technique is very advantageous because the well is isolated from other wells, such that each well can be controlled separately and therefore the well can be controlled much better. Whereas, generally, in bulk CMOS, the wells are connected together, making it more difficult to control one area separately. Therefore, for other technologies, the control of well is also possible, however is more limited, thereby limiting the performance of the CMOS.

Figure 4A:
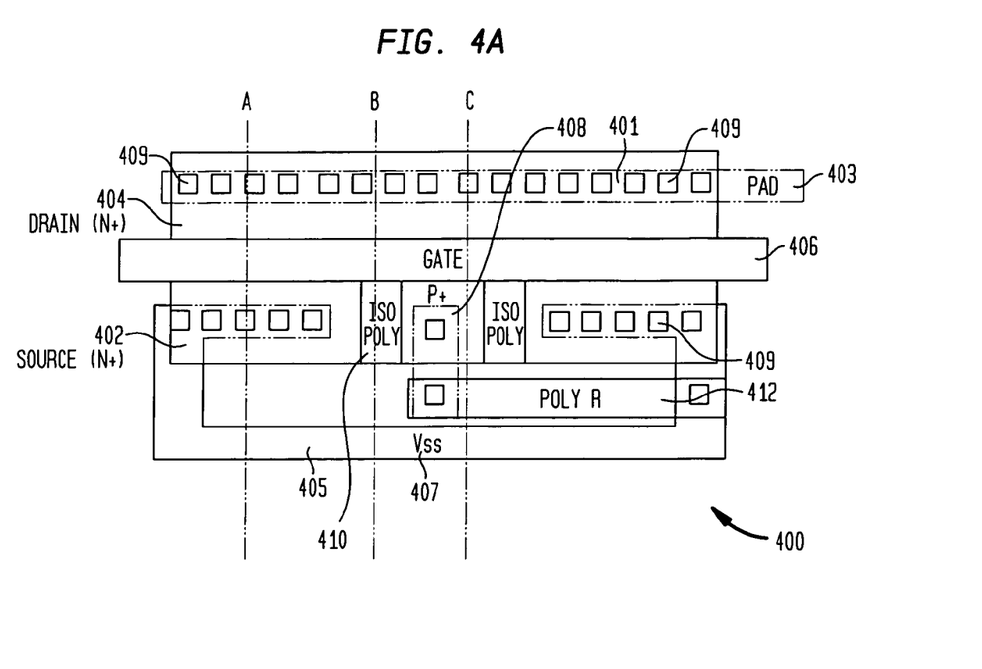
FIG. 4A depicts a top view of a first embodiment of the MOS device of the present invention.

Referring to FIG. 4A, there is shown a top view of a single finger NMOS device 400 according to one embodiment of the present invention. The NMOS 400 comprises a source region 402, a drain region 404 and a gate region 406. The gate region 406 is disposed over a channel formed by Pwell (not shown) between the source 402 and the drain region 404 in a conventional manner known by those skilled in the art. As shown in FIG. 4A, the drain 404 is connected via a first metal line 401 to a first voltage potential 403 connected to external circuitry (not shown) and the source 404 is coupled to via a second metal line 405 to a second voltage potential 407 preferably connected to ground or another circuitry (not shown).

The source region 402 is interrupted by P+ areas or bulk connection 408 called is placed as illustrated in FIG. 4A. In order to avoid shorting the P+ 408 with the N+ source 402 through silicide, an isolation gate 410 is placed between P+ 408 and N+ 402. The isolation gate 410 provides an isolation between the P+ bulk connection 408 and the source 402. This isolation gate 410 is made in the same way as the gate 406, thus named isolation poly 410. Alternatively, isolation poly 410 or in more general isolation gate can be preferably replaced with silicide block or STI block or any other isolation layer, not only in this embodiment, but for all other implementations in this invention. For the purpose of providing a larger area efficiency, isolation poly will be used throughout this invention application.

Since this bulk connection 408 is now isolated from the source 402 by the isolation poly 410, it can be connected to an external poly resistance 412 through contacts 409 via a third metal line 414 to increase the bulk resistance to any desirable level. The contacts 409 are the connection between the bulk region and the metal line 414 to the poly resistance 412. The isolation poly 410 creates a high ohmic path between the source 402 and the bulk connection 408 by blocking the silicide layer. Note, that the silicide between the source 402 or the bulk connection 408 is not connected with the silicide on the isolation poly (gate) 410. So the three regions, source 402, isolation poly 410 and the bulk connection 408 are electrically isolated from each other. In case of using a silicide block as an isolation gate 410 instead of poly, the silicide is blocked at the border between source 402 and the bulk connection 408. This also prevents the shortening of the source 402 and bulk connection 408. Thus, the added poly resistance 412 can be adjusted to influence the bulk resistance 408, thereby controlling the voltage of the bulk connection 408 and the voltage of the channel region under the gate 406. Note that although in this implementation a poly resistor is proposed, the invention is not limited to any specific kind of impedance element, being active or passive such as diodes, MOS devices, well resistances, capacitors, SCRs, inductors, short, etc. Although, not shown in FIG. 4 the bulk connection area 408 can be alternatively be placed at the drain side 404 or at the both drain 404 and the source 402 sides.

Figure 4B:
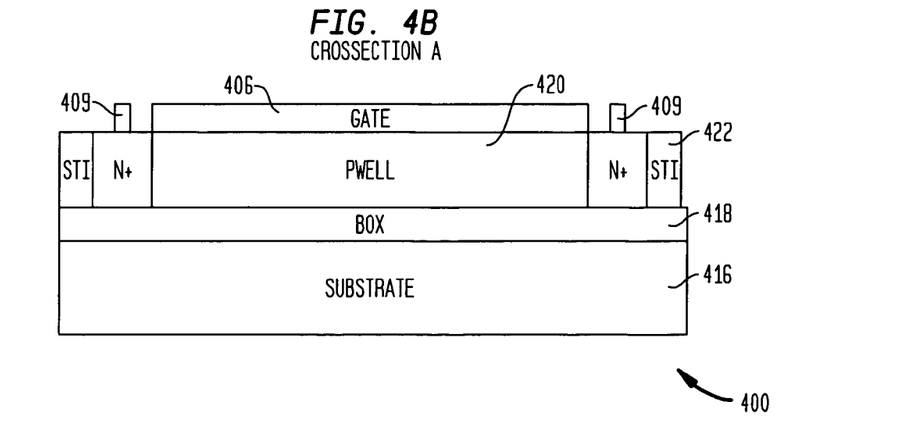
FIG. 4B depicts a cross-section view along line A of MOS device of FIG. 4A.
Figure 4C:
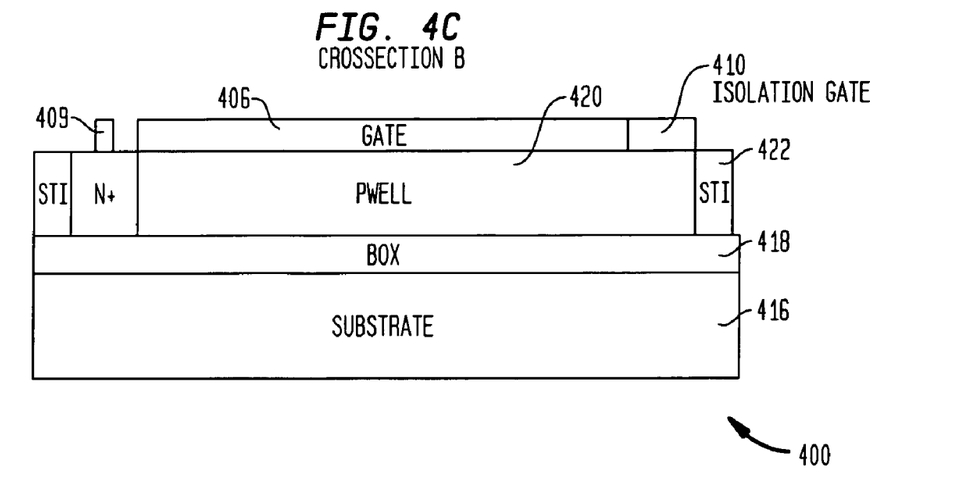
FIG. 4C depicts a cross-section view along line B of the MOS device of FIG. 4A.
Figure 4D:
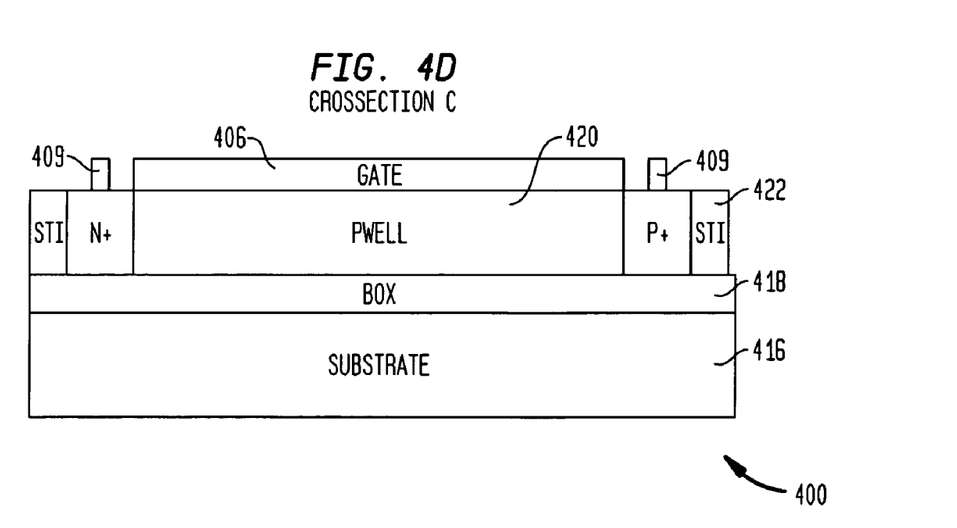
FIG. 4D depicts a cross-section view along line C of the MOS device of FIG. 4A.

Also shown are FIG. 4B, FIG. 4C and FIG. 4D depicting cross section views along line A, line B and line C respectively of the single finger NMOS 400 of FIG. 4A. As shown, the single finger NMOS device 400 is formed in a substrate 416 having an insulating layer (BOX) 418 buried over the substrate 416. Specifically, a P-well 420 is formed over the BOX layer 418 and the single finger NMOS device 400 is formed in the P-well 420. Preferably, two Shallow Trench Isolation (STI) regions 422 are formed at each end of the substrate 416. In particular, the STI regions 422 extend down the buried oxide (BOX) layer 418. It is noted that even though STI is used as one example of the isolation, it's also possible to use partial trench isolation (PTI), deep trench isolation (DTI), or other isolations known in the art. Alternatively, it is also possible to not include these isolations and place another device adjacent to this structure.

Figure 5:
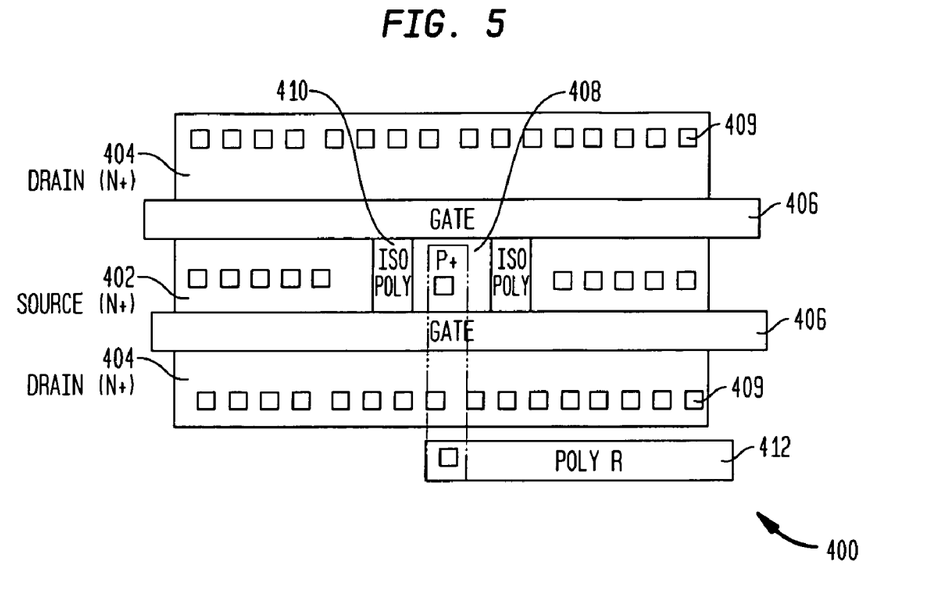
FIG. 5 depicts a top view of a second embodiment of the MOS of the present invention.

Referring to FIG. 5, there is shown a top view of a two finger NMOS 400 in accordance with another embodiment of the present invention. Each of the finger 400 is placed adjacent to each other and comprises the source 402, drain 404 and the gate 406 disposed over the channel region. An isolation poly 410 is placed in the source region which in turn connects the gates 406. of each finger. Thus, the channels of the two adjacent fingers 400 are connected below the isolation poly 410, therefore improving bulk coupling of the fingers. The two channel regions of the two fingers are connected together, so that during triggering current from the first finger which triggers, is also injected in the second finger, thereby improving multifinger triggering. Similar to FIG. 4, a bulk connection 408 can be added in FIG. 5 isolated from the source region through the isolation poly 410. This isolation poly can be also connected to an external poly resistance 412 via a metal line 414 to increase the bulk resistance to any desirable level. The isolation poly and bulk connection can be also placed in the drain 404 instead of the source 402. It's noted also that with a multifinger structure this technique must not be applied to all the fingers.

Figure 6A:
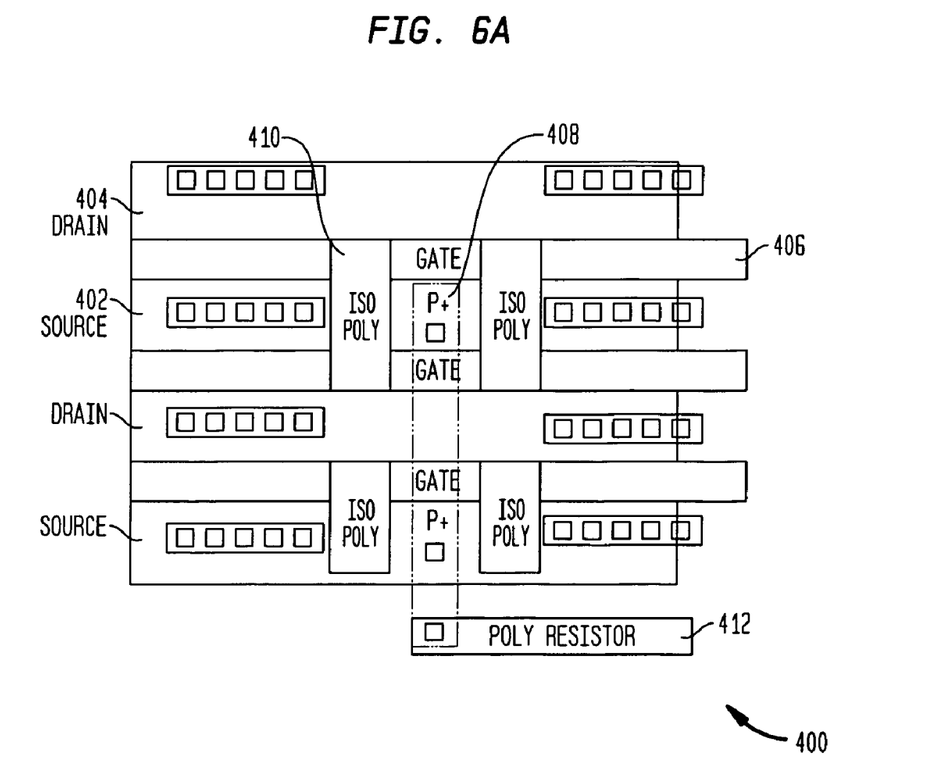
FIG. 6A depicts a top view of a third embodiment of the MOS of the present invention.

Referring to FIG. 6A, there is shown a top view of a multiple finger NMOS 400, in accordance with further embodiment of the present invention. Each of the finger 400 is placed adjacent to each other and comprises the source 402, drain 404 and the gate 406 disposed over the channel region. An isolation poly 410 is placed in the source, which in turn connects the gates 406 of each adjacent finger 400. Thus, the two adjacent fingers 400 are connected below the isolation poly 410, therefore improving bulk coupling of the fingers as discussed above. Similar to FIG. 4, the bulk connection 408 can be placed between the isolation poly 410 in FIG. 6A and can be connected to an external poly resistance 412 via a metal line 414 to increase the bulk resistance to any desirable level. In this figure an additional technique is shown, i.e. the contacts 409 and the metal line 414 of the drain 404 are left out in the drain region 404 at the metal connection of the bulk region 408 to the impedance element, i.e. poly resistance 412. This additional technique is applicable if the first metal layer 401 is used as connection to prevent shortening between the drain 404 and the bulk connection 408.

Figure 6B:
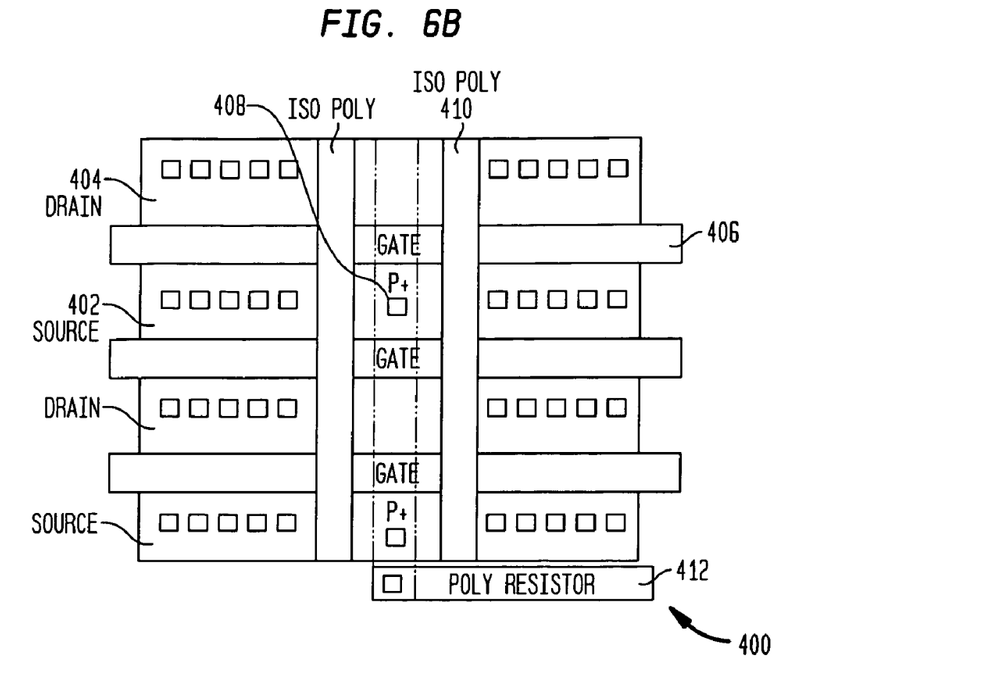
FIG. 6B depicts a top view of an alternate embodiment of the MOS of FIG. 6A of the present invention.

Additionally, this bulk coupling can be even more exploited by extending the isolation poly 410 over the drain junctions 404, thus connecting all the gates 406 of all the multiple fingers 400, as illustrated in FIG. 6B. The advantage shown in FIG. 6 B is that the channel region of all the fingers 400 are better coupled together through the isolation poly 410 and through the bulk connection 408. It's noted that also in this figure, the technique can be applied without the bulk connection 408 only at the isolation gate 410.

Figure 7:
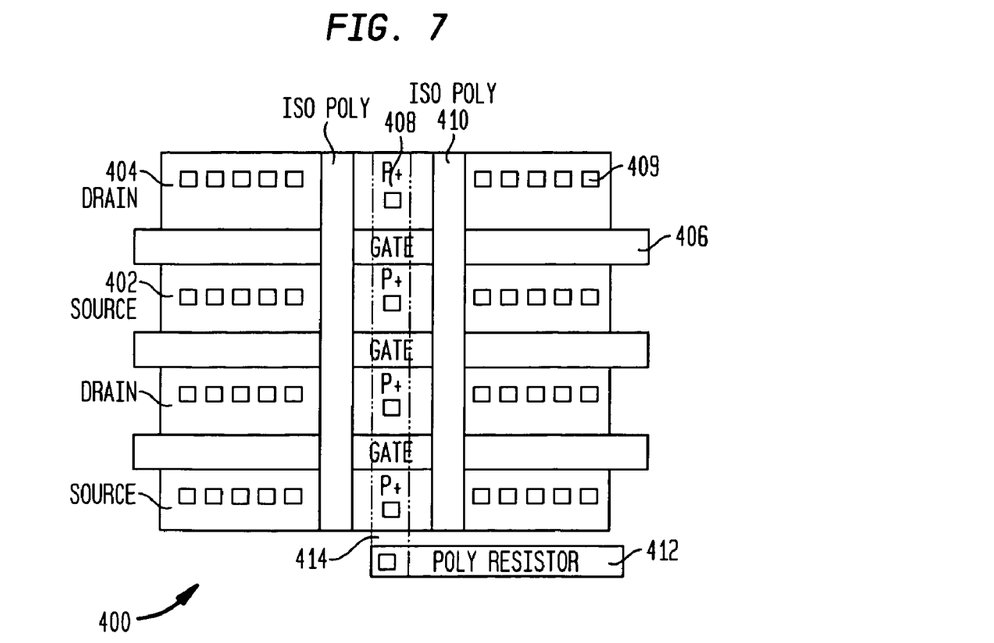
FIG. 7 depicts a top view of a fourth embodiment of the MOS of the present invention.

Referring to FIG. 7, there is shown an another embodiment of the multiple finger device 400 of the present invention. In this embodiment, both the drain 404 and the source 406 regions are interrupted with P+ bulk areas 408. The advantage with this technique is that it provides a better bulk connection and easier metallization (i.e. less metal layers needed).

Figure 8:
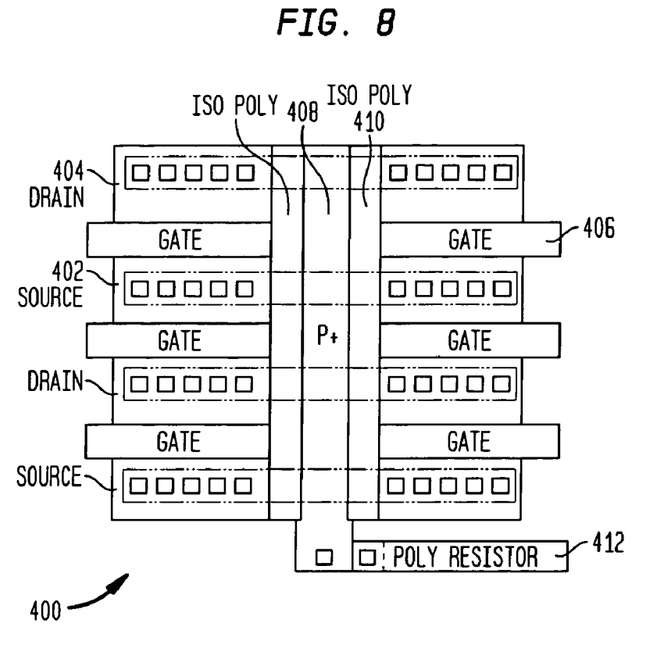
FIG. 8 depicts a top view of a fifth embodiment of the MOS of the present invention.

Referring to FIG. 8, there is shown a further embodiment of the multiple finger device 400. In this implementation, the P+ bulk connection areas 408 are merged into one long stripe over all the fingers of the device 400. Aside from previously mentioned advantages of the invention, additional advantages are associated with this embodiment. Since this P+ area 408 is low ohmic due to silicidation, the contacts 409 to this region can be placed at the end of the P+ stripe region 408. This frees up the second metal line 405 above the bulk connection area, such that this metal can used for another purpose. In FIG. 8, this metal can be used to connect the different parts of source 402 together (i.e. the source 402 isolated through the placement of the bulk connection 408) and can also be used to connect the different parts of the drain 404. Since no contacts 409 need to be placed between the isolation poly 410, these can be placed more closely together, thus saving the area to make a more compact multi-finger device 400.

Figure 9:
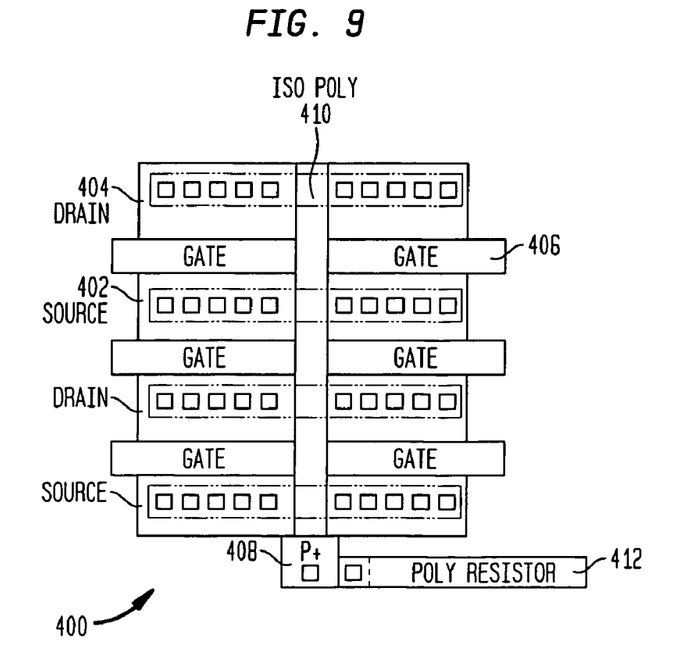
FIG. 9 depicts a top view of a sixth embodiment of the MOS of the present invention.

Furthermore, in this implementation it is easy to see that gates 406 in between the bulk connection areas 408 can be omitted without loss of performance Referring to FIG. 9, there is shown an even further embodiment of the multiple finger device 400. The bulk connection 408 is placed at one end of the isolation poly 410. This P+ area 408 can be enlarged to allow for more contacts 409 to make a better connection to the impedance element, i.e. the poly resistor 412.

It is noted that for all the embodiments as described above, the isolation poly 410 and thus the gate 406 of the MOS device 400 can be connected to any circuitry. For instance, an ESD circuitry could pull the gate/isolation poly of the device high (low for PMOS) during ESD thus reducing the amount of avalanche multiplication even further. This will also reduce the bulk resistance below the isolation poly 410 and therefore reduce the bulk resistance difference between the outer and inner fingers. Also note that if the P+ bulk area 408 would be omitted or placed elsewhere, the isolation poly 410 would still play an important role such that it would increase bulk coupling between the fingers such that the channel regions of the different fingers are connected together (through a channel region) under the isolation poly to improve multifinger triggering.

Some examples of the use of this improved NMOS described in the inventions is the use as an ESD protection clamp or as a trigger to another clamp or as an output driver, or any other known ESD devices.

Although various embodiments that incorporate the teachings of the present invention have been shown and described in detail herein, those skilled in the art can readily devise many other varied embodiments that still incorporate these teachings without departing from the spirit and the scope of the invention.

The invention claimed is:

1. A MOS transistor for providing ESD protection, said MOS transistor comprising: at least one interleaved finger comprising at least one source region of first conductivity type, at least one drain region of the first conductivity type and at least one gate region formed over a channel region disposed between said source and drain regions, at least one isolation gate formed in at least one of the source, the drain and the gate regions of the said at least one interleaved finger; and a bulk connection of a second conductivity type placed in one of the source, gate and drain regions of said at least one interleaved finger.

2. The MOS transistor of claim 1 further comprising: a substrate having an insulating layer formed over the substrate; and a well of second conductivity type formed over the insulating layer, wherein said at least one interleaved finger is formed in the well.

3. The MOS transistor of claim 2 wherein said first conductivity type comprises one of n or p conductivity types.

4. The MOS transistor of claim 3 wherein said second conductivity type comprises other of the n or p conductivity types.

5. The MOS transistor of claim 1 wherein said isolation gate is formed perpendicular to said gate region and across said at least one of the source, the drain regions of said interleaved finger.

6. The MOS transistor of claim 1 further comprising a first bulk connection placed in the source region of said interleaved finger, wherein said first bulk connection is isolated to the source region through said isolation gate.

7. The MOS transistor of claim 6 wherein the first bulk connection is coupled to the source region of said interleaved finger through at least one of low ohmic connection, diode, MOS, resistor, capacitor and inductor.

8. The MOS transistor of claim 1 further comprising a second bulk connection placed in the drain region of said interleaved finger, wherein said second bulk connection is isolated to the drain region through said isolation gate.

9. The MOS transistor of claim 1 further comprising a third bulk connection placed in the gate region of said interleaved finger, wherein said third bulk connection is isolated to the gate region through said isolation gate.

10. The MOS transistor of claim 1 further comprising a fourth bulk connection formed at one end of said isolation gate external to the source, the gate and the drain regions of said interleaved finger.

11. The MOS transistor of claim 1 wherein said isolation gate and said gate regions are made of a substantially similar material.

12. The MOS transistor of claim 1 wherein said isolation gate is made of a silicide block.

13. The MOS transistor of claim 1 wherein said first conductivity type comprises one of the n or p conductivity type.

14. The MOS transistor of claim 1 wherein said second conductivity type comprises other of the n or p conductivity type.

15. A MOS transistor for providing ESD protection, said MOS transistor comprising: a plurality of interleaved fingers, wherein each said finger comprising at least one source region, at least one drain region and at least one gate region formed over a channel region disposed between said source and drain regions, wherein said channel regions of the two fingers are connected together by at least one isolation gate; and at least one bulk connection of second conductivity type formed in at least one of the plurality of interleaved fingers.

16. The MOS transistor of claim 15 wherein said isolation gate and said gate region are made of a substantially similar material.

17. The MOS transistor of claim 15 wherein said isolation gate is made of a silicide block.

* * * * *